US012601793B2

(12) United States Patent
Ma et al.

(10) Patent No.: US 12,601,793 B2
(45) Date of Patent: Apr. 14, 2026

(54) OPEN-PHASE FAULT MONITORING SYSTEM

(71) Applicant: Fujian Fuqing Nuclear Power Co., Ltd., Fuzhou (CN)

(72) Inventors: Tiejun Ma, Fuzhou (CN); Jun Hu, Fuzhou (CN); Shanghui Wang, Fuzhou (CN); Yong Ouyang, Fuzhou (CN); Chao Yang, Fuzhou (CN); Ran Bi, Fuzhou (CN); Hua Liu, Fuzhou (CN); Shiyi He, Fuzhou (CN); Haoyu Ma, Fuzhou (CN); Jinliang He, Fuzhou (CN); Huiquan Zhang, Fuzhou (CN); Shi Pan, Fuzhou (CN); Zeyin Zheng, Fuzhou (CN); Jianhong You, Fuzhou (CN); Xin Lin, Fuzhou (CN); Yang Deng, Fuzhou (CN); Xinzhou Ni, Fuzhou (CN); Weimin Chen, Fuzhou (CN)

(73) Assignees: FUJIAN FUQING NUCLEAR POWER CO., LTD., Fuqing (CN); TSINGHUA UNIVERSITY, Beijing (CN)

( * ) Notice: Subject to any disclaimer, the term of this patent is extended or adjusted under 35 U.S.C. 154(b) by 253 days.

(21) Appl. No.: 18/700,930

(22) PCT Filed: Apr. 24, 2023

(86) PCT No.: PCT/CN2023/090314
§ 371 (c)(1),
(2) Date: Apr. 12, 2024

(87) PCT Pub. No.: WO2024/221172
PCT Pub. Date: Oct. 31, 2024

(65) Prior Publication Data
US 2025/0237712 A1 Jul. 24, 2025

(51) Int. Cl.
H02H 3/00 (2006.01)
G01R 31/54 (2020.01)

(52) U.S. Cl.
CPC ................................... G01R 31/54 (2020.01)

(58) Field of Classification Search
CPC ...................................................... G01R 31/54
See application file for complete search history.

(56) References Cited

U.S. PATENT DOCUMENTS 11,589,888 B2 * 2/2023 Shelton, IV ........... G16H 70/20
11,938,825 B2 * 3/2024 Sukhatankar .......... B60K 6/387
(Continued)

FOREIGN PATENT DOCUMENTS

CN 201113396 Y 9/2008
CN 103107602 A 5/2013
(Continued)

OTHER PUBLICATIONS

International Search Report for corresponding International Patent Application No. PCT/CN2023/090314, dated Jan. 20, 2024, 3 pages.

*Primary Examiner* — Stephen W Jackson
(74) *Attorney, Agent, or Firm* — LOZA & LOZA, LLP; Michael Fedrick

(57) ABSTRACT

The present disclosure relates to the technical field of electrical device state monitoring, and particularly discloses an open-phase fault monitoring system, in which a relay communication unit is configured with an MCU as a central control processing unit, and an external ADC realizes high-speed A/D conversion for a plurality of signals; a timing function is realized by a GNSS&RTC of the relay communication unit, a data interaction function is realized by a LORA module, and data is sent to a background industrial personal computer based on a designed sampling frequency. The system of the present disclosure has the advantages of (Continued)

1 Current Monitoring Unit

Electric Energy Management Module

Magnetic Field Sensing Chip with Magneto-Resistive type

Magnetic Field Sensing Chip with Magneto-Resistive type

Instrument Amplifier Circuit

Instrument Amplifier Circuit

4 Relay Communication Unit small volume, high precision, low cost, easy installation and the like, and realizes real-time monitoring and accurate identification of a line open-phase fault of an auxiliary power supply system in a nuclear power plant.

20 Claims, 6 Drawing Sheets

(56)                    References Cited

U.S. PATENT DOCUMENTS

| | | | | |
|---|---|---|---|---|
| 2016/0202306 A1* | 7/2016 | Ha | ..................... | G01R 19/0092 |
| | | | | 324/127 |
| 2021/0098985 A1* | 4/2021 | Kim | ......................... | H02H 7/26 |
| 2024/0213761 A1* | 6/2024 | Gao | ......................... | H02H 3/04 |

FOREIGN PATENT DOCUMENTS

| | | | |
|---|---|---|---|
| CN | 105634123 A | 6/2016 |
| CN | 206339615 U | 7/2017 |
| CN | 206818777 U | 12/2017 |
| CN | 108649532 A | 10/2018 |
| CN | 109541393 A | 3/2019 |
| CN | 110687408 A | 1/2020 |
| CN | 111948488 A | 11/2020 |
| CN | 112834811 A | 5/2021 |
| CN | 113608025 A | 11/2021 |
| CN | 215932098 U | 3/2022 |
| JP | 2013062955 A | 4/2013 |

* cited by examiner

OPEN-PHASE FAULT MONITORING SYSTEM

CROSS-REFERENCE TO RELATED APPLICATIONS

This application is the U.S. national stage of International Patent Application No. PCT/CN2023/090314, filed on Apr. 24, 2023, which is hereby incorporated by reference in its entirety.

TECHNICAL FIELD

The present disclosure relates to the technical field of electrical device state monitoring, and particularly to an open-phase fault monitoring system.

BACKGROUND

The open-phase event of an auxiliary power system in a nuclear power plant refers to the phenomenon that one or two phases of an external power supply of the system are lost for a long time, which is usually caused by the disconnection and suspension of at least one of overhead lines or the incomplete phase closure of switching appliances. After the main power supply system of the nuclear power plant is switched to an auxiliary line with open-phase, the key device of the nuclear power plant safety system will not operate normally due to the failure of normal power supply, thereby leading to more serious nuclear safety accidents. The operation experience report of the World Association of Nuclear Operators (WANO) considers that the open-phase event is a great challenge to the nuclear safety of nuclear power plants, and it is necessary to carry out identifications and evaluations, take measures to the system of dealing with the lack of the capability of the open-phase detection, and develop a long-term transformation plan to make it capable of detecting.

Nuclear power plants at home and abroad generally adopt voltage levels such as 132 kV, 220 kV, etc. as power supplies of the auxiliary power supply system, and the conventional line open-phase monitoring methods include the modes of current-type protection and voltage-type protection. In the voltage-type protection, due to the three-phase induction, the voltage after the phase losing may be obtained by synthesis, w % bile the amplitude and the phase angle are substantially unchanged, and it is difficult to monitor the open-phase event of a uniphase by this mode. In the current-type protection, since the operation is in the no-load operating condition for a long time and the load current is of mA level, the current does not change obviously after the phase losing, so it is difficult to make an accurate detection by the traditional measuring means such as the current transformer (CT).

Therefore, it is urgent to develop an open-phase fault monitoring system to solve the above problems.

SUMMARY

An objective of the present disclosure is to provide an open-phase fault monitoring system. A current monitoring system based on a magneto-resistive magnetic field sensing chip may be conveniently installed at a busbar or a cable of an auxiliary power supply system of a nuclear power plant and monitor the current of the busbar or the cable of an auxiliary power supply system of a nuclear power plant, and realize the online open-phase identification of a transformer.

The technical solutions of the present disclosure are as follows:

An open-phase fault monitoring system, including a current monitoring unit, a relay communication unit, an energy extraction unit, and a data processing unit;

the current monitoring unit is configured to monitor multipath current signals, and includes a cable current monitoring unit and a ground current monitoring unit, in which the cable current monitoring unit is configured to monitor current flowing through a transformer cable, and the ground current monitoring unit is configured to monitor current flowing through a reverse current ground wire;

each of the cable current monitoring unit and the ground current monitoring unit is an ring shape and is enclosed by two ferrite rings, where a center hole passes through a conductor to be measured, and a magnetic ring air gap is machined on one of the ferrite rings to arrange a current monitoring unit circuit; one terminal of each of the two ferrite rings is connected by a rotation shaft, and the other terminal thereof is provided with a connecting line interface where a connecting line is inserted to connect the current monitoring unit with the relay communication unit; the cable current monitoring unit and the ground current monitoring unit have a same circuit structure, both including two magnetic field sensing chips with tunnel junction magneto-resistive type, and each magnetic field sensing chip with tunnel junction magneto-resistive type is connected to one instrument amplifier circuit and one electric energy management module of the current monitoring unit;

a hardware part of the relay communication unit includes a body, an antenna, a connecting line interface C, a battery compartment, a system restart key and a debugging interface; a circuit part of the relay communication unit is disposed on a printed circuit board, and includes an MCU, a LORA module, an ADC, a FLASH&WD, a GNSS&RTC module, a power management module of the relay communication unit and corresponding resistor-capacitor elements connected to the power management module, the antenna is disposed at the top of the body and connected to the LORA module and the GNSS&RTC module in the body of the relay communication unit; the LORA module enhances a signal via the antenna, and wirelessly sends data to the data processing unit for data processing; the GNSS&RTC module obtains time data from a satellite via the antenna to realize a data transceiving function of the relay communication unit; the connecting line interfaces C is disposed at the bottom of the body for a wired connection between the relay communication unit and the energy extraction unit and the current monitoring unit, and meanwhile, the connecting line interface C is connected to the printed circuit board and the power management module of the relay communication unit inside the body; the battery compartment is disposed on a lateral side of the body, with a battery placed therein, and the battery is connected to the printed circuit board inside the body; the system restart key and the debugging interface are disposed on a lateral side of the body, the relay communication unit is refreshed by clicking the system restart key, and the relay communication unit is connected to a computer by the debugging interface, so as to modify and debug a program of the relay communication unit;

the MCU of the relay communication unit is used as a central control processing unit and connected to ADC peripheral; the ADC converts the transmitted analog signal into a digital signal, and multipath analog signals is obtained in a short time; the FLASH&WD stores the data obtained and converted by the ADC, and the data is written into the FLASH&WD after being processed by the MCU, so that the past data is queried when the open-phase fault monitoring system is failed;

the LORA module is connected to the MCU on the printed circuit board to realize a function of data wireless communication; a working condition of the LORA module is controlled by the MCU to realize a continuous or intermittent data transmission to an industrial personal computer;

the GNSS&RTC realizes a time calibration by a connection with the MCU to provide accurate moment signals, and calibrates a system clock continuously or intermittently;

the energy extraction unit includes two independent groups of magnetic ring for obtaining electrical energy based on induction principle, corresponding connecting circuits and a connecting line interface D; the inductive electromagnetic ring is wound with a coil, an outlet terminal of the coil is connected to an input terminal of the printed circuit board, and a rectifier bridge composed of capacitors is arranged on the printed circuit board; the rectifier bridge includes two input terminals connected to two terminals of the coil respectively and an output terminal connected to an input terminal of a voltage regulator chip, and an output terminal of the voltage regulator chip outputs via the connecting line interface D; the energy extraction unit obtains electric energy and supplies power to the current monitoring unit and the relay communication unit;

the data processing unit wirelessly receives information sent by the relay communication unit to perform a data analysis, and includes the industrial personal computer, a relay and a LORA receiving device; the industrial personal computer is in wired connection the relay by a USB serial port, and directly connected to the LORA receiving device by the USB serial port; the industrial personal computer receives current data sent by the LORA module in the relay communication unit by the LORA receiving device, and the current data is directly read by the industrial personal computer by the USB serial port with a serial communication mode; the industrial personal computer judges phase opening based on the current data and controls the output of the relay.

The magnetic field sensing chip with tunnel junction magneto-resistive type is configured to monitor and convert a magnetic field intensity of the conductor to be measured into an analog differential voltage, and an output terminal of the magnetic field sensing chip with magneto-resistive type is connected to the instrument amplifier circuit; the instrument amplifier circuit is implemented by combining an instrument amplification chip with a resistor-capacitor element to amplify the analog differential voltage and output an analog voltage signal:

the electric energy management module of the current monitoring unit is composed of a voltage regulator chip, and the voltage regulator chip is connected to the magnetic field sensing chip with magneto-resistive type and the instrument amplifier circuit, respectively, so as to provide a power supply voltage for the magnetic field sensing chip with magneto-resistive type and the instrument amplifier circuit, and provide a reference voltage for the instrument amplifier circuit.

The connecting line interface C is in wired connection with the connecting line interface D in the energy extraction unit to supply power for the relay communication unit; an output terminal of the power management module of the relay communication unit is in wired connection with the connecting line interface C inside the body.

The connecting line interface C is connected to connecting line interfaces A and B of the current monitoring unit to supply power for the current monitoring unit and realize an information transmission.

The output terminal of the power management module of the relay communication unit is in wired connection with the connecting line interface C, and an input terminal of the power management module of the current monitoring unit is in wired connection with the connecting line interfaces A and B; and, an analog signal output terminal of the current monitoring unit is connected to the connecting line interfaces A and B of the current monitoring unit by cables, an ADC input terminal of the relay communication unit is connected to the connecting line interface C by cables, and the connecting line interfaces A and B of the current monitoring unit are externally in wired connection with the connecting line interface C of the relay communication unit.

The wired connection between the relay communication unit and the current monitoring unit is configured with multi-core wires, so that a current obtainment signal output by the current monitoring unit is transmitted to the relay communication unit, and energy output by the energy management module of the relay communication unit is transmitted to a plurality of the current monitoring units.

The hardware part of the relay communication unit further includes thermal fins uniformly distributed outside the body to reduce accumulated heat generated when the relay communication unit works.

If intermittent timing is configured with, the MCU uses its own clock or a peripheral crystal oscillator clock to count time when a timing module of the GNSS&RTC is closed, so as to achieve a time measurement.

When the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats; next, it is judged whether there is any device abnormality or phase opening:

when any one of the following situations occurs, it is determined that there is a device abnormality;

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal;

after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

When current monitoring data received by the data processing unit meets the following two conditions at the same time, and a same abnormality occurs for two consecutive times, it is determined that an open-phase fault has occurred:

a) open-phase judgment based on a threshold: when phase opening occurs, generally, currents of a ground wire and a core wire of a wire of one phase are dropped and disappeared, and when currents of the ground wire and the core wire both drop to near zero, while currents of other sensors still exist, it is determined that there is an open-phase event;

b) open-phase judgment based on zero-sequence current: under normal working conditions, there is no zero-sequence current in either of the core wire and the ground wire, and when calculated zero-sequence currents in both the core wire and the ground wire exceed a threshold (e.g., 0.5 A), it is determined that there is an open-phase event;

the current monitoring data received by the data processing unit is continuously monitored after the open-phase fault is eliminated, and when a same abnormality does not appear for two consecutive times, it is determined that an abnormal event is eliminated.

The present disclosure has the following notable effects:

The present disclosure proposes an open-phase monitoring system, which has the advantages of small volume, high precision, low cost, easy installation and the like, and realizes real-time monitoring and accurate identification of a line open-phase fault of an auxiliary power supply system in a nuclear power plant.

(1) The system of the present disclosure adopts a small-volume current monitoring unit with tunnel junction magneto-resistive type magnetic field sensors as the core, so as to measure no-load operation currents of the three-phase cable and the ground wire of the auxiliary power transformer in the nuclear power plant, thereby avoiding the problems of large volume of traditional current transformers and limited installation environment;

(2) based on current measurement data of the tunnel junction magneto-resistive type magnetic field sensors, the system of the present disclosure obtains a current measurement result by processing by a single chip microcomputer, and the current measurement result is transmitted to the data processing unit by a Long Range Radio (LORA) module in the relay communication unit; the open-phase situation of the auxiliary power transformer of the nuclear power plant is judged by the data processing unit based on the algorithms of two judgement conditions, i.e., a threshold and zero sequence current, thereby improving the accuracy of the open-phase fault detection for the auxiliary power transformer of the nuclear power plant;

(3) the system of the present disclosure adopts the Global Navigation Satellite System (GNSS) & Real-time Clock (RTC) module to calibrate the current monitoring time, so as to facilitate a monitoring center to judge when an open-phase fault occurs based on received time data, and facilitate maintenance personnel to make a reconditioning plan in time.

BRIEF DESCRIPTION OF THE DRAWINGS

In order to more clearly illustration the technical solutions in the embodiments of the present disclosure, the drawings required for describing the embodiments will be briefly introduced below. Obviously, the drawings involved in the following description are only for the purpose of illustrating the technical solutions in the embodiments of the present disclosure or in the prior art more clearly, and persons of ordinary skill in the art may obtain other drawings from them without paying any creative effort.

In the drawings.

1: current monitoring unit; 2: cable current monitoring unit; 2-1: ferrite ring A; 2-2: connecting line interface A; 2-3: magnetic ring air gap A; 3: ground current monitoring unit; 3-1: ferrite magnetic ring B; 3-2: connecting line interface B; 3-3: magnetic ring air gap B; 4: relay communication unit; 4-1: antenna; 4-2: thermal fins; 4-3: connecting line interface C; 4-4: battery compartment; 4-5: system restart key and debugging interface; 5: energy extraction unit; 5-1: inductive electromagnetic ring; 5-2: connecting line interface D; 6: data processing unit; 6-1: industrial personal computer; 6-2: relay; 6-3: LORA receiving device.

DETAILED DESCRIPTION

The technical solutions in the embodiment of the present disclosure will be clearly and completely described below with reference to the drawings of the embodiments of the present disclosure. Obviously, those described are only a part, rather than all, of the embodiments of the present disclosure. Based on the embodiments in the present disclosure, any other embodiment obtained by those of ordinary skill in the art without paying any creative effort should fall within the protection scope of the present disclosure.

Figure 1:
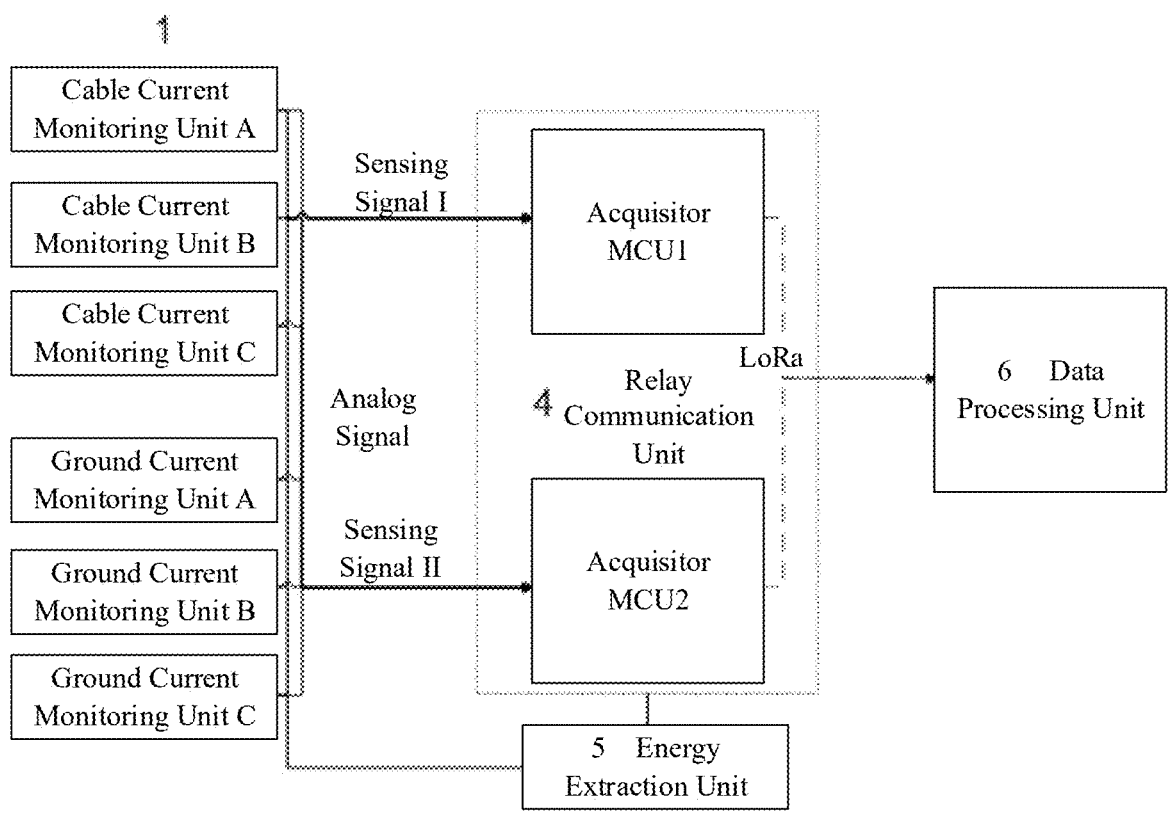
FIG. 1 illustrates a schematic diagram of a topological structure of an open-phase fault monitoring system according to the present disclosure.

FIG. 1 illustrates an open-phase fault monitoring system, which includes a plurality of current monitoring units 1, a relay communication unit 4, an energy extraction unit 5 and a data processing unit 6.

Figure 2:
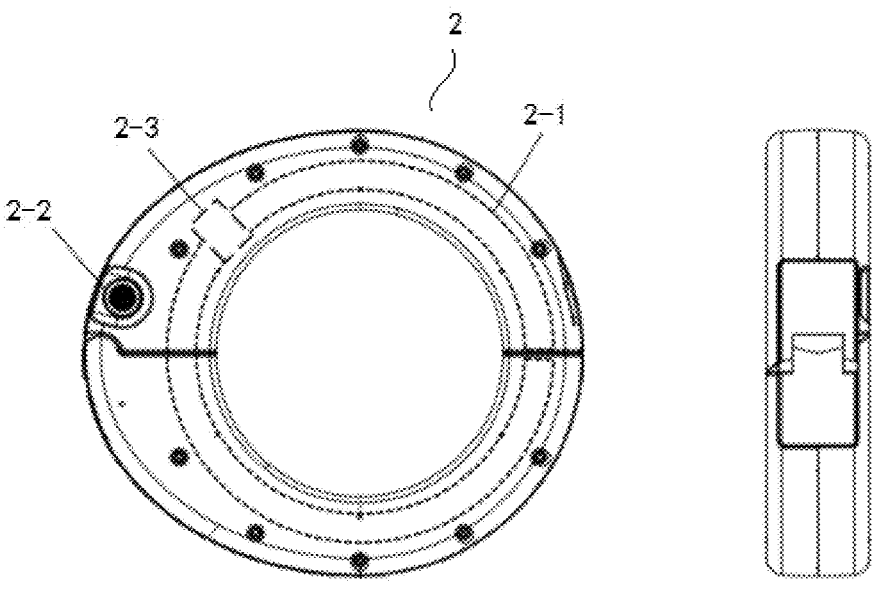
FIG. 2 illustrates a schematic diagram of a cable current monitoring unit according to the present disclosure.
Figure 3:
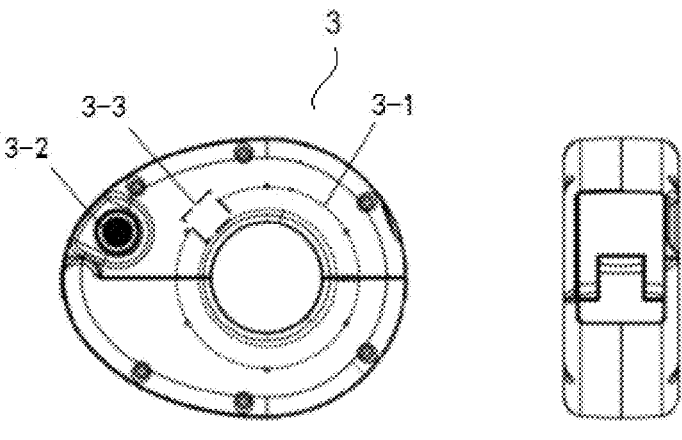
FIG. 3 illustrates a schematic diagram of a ground current monitoring unit according to the present disclosure.

As illustrated in FIGS. 2 and 3, the current monitoring unit 1 is configured to monitor multiple current signals, and includes a cable current monitoring unit 2 and a ground current monitoring unit 3. In this embodiment, the cable current monitoring unit 2 is configured to monitor current flowing through a transformer cable with a wide size, and the ground current monitoring unit 3 is configured to monitor current flowing through a reverse current ground wire with a fine size, so the size of the cable current monitoring unit 2 is larger than that of the ground current monitoring unit 3. Each of the cable current monitoring unit 2 and the ground current monitoring unit 3 is an ring shape and is enclosed by two ferrite rings, where a center hole passes through a conductor to be measured, and a magnetic ring air gap is machined on one of the ferrite rings to arrange a current monitoring unit circuit. One terminal of each of the two ferrite rings is connected by a rotating shaft, and the other terminal thereof is provided with a connecting line interface where a connecting line may be inserted to connect the current monitoring unit 1 with the relay communication unit 4. The ferrite ring can reduce the measurement error caused by situations such as crosstalk of nearby wires and wire eccentricity, and improve the quality of the analog signal output by the current monitoring unit 1. During the measurement of conductor current, the conductor whose current is to be measured may be placed in a central hole of the cable current monitoring unit 2 or the ground current monitoring unit 3 for current monitoring.

Figure 4:
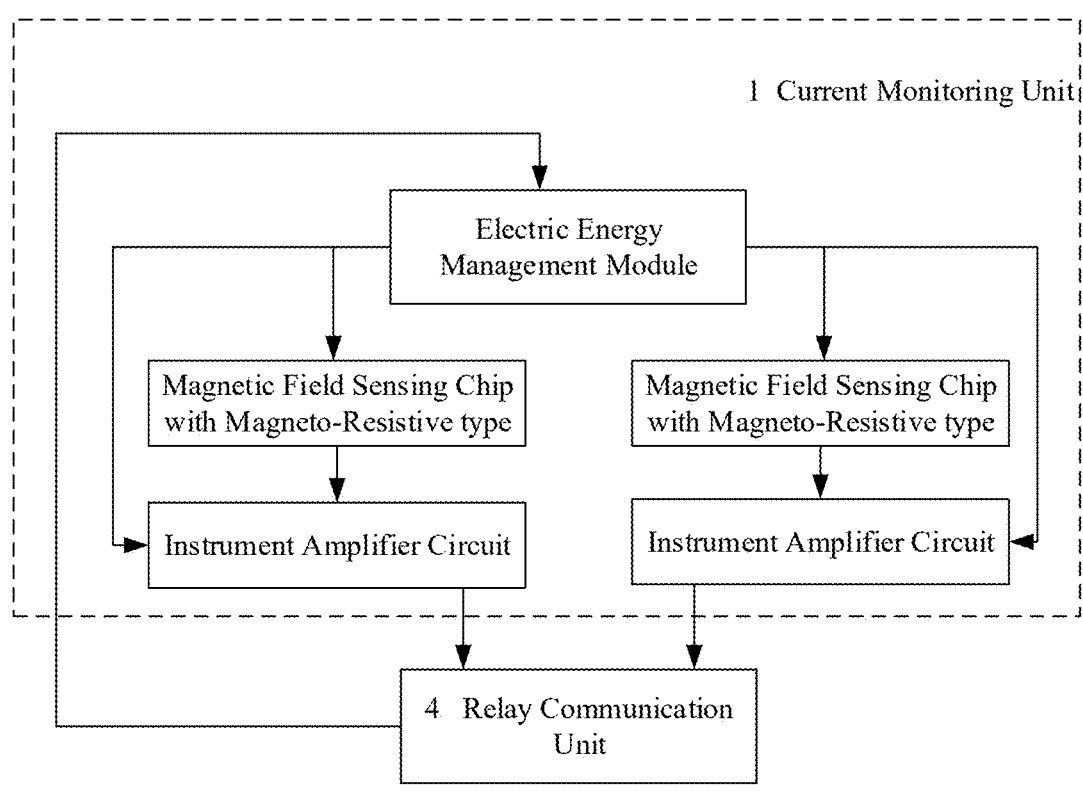
FIG. 4 illustrates a schematic diagram of a circuit topology of a current monitoring unit according to the present disclosure.

As illustrated in FIG. 4, the current monitoring unit circuit takes a magnetic field sensing chip with tunnel junction magneto-resistive type as the core. The cable current monitoring unit 2 and the ground current monitoring unit 3 have the same circuit structure, both including two magnetic field sensing chips with tunnel junction magneto-resistive, and the two magnetic field sensing chips with tunnel junction magneto-resistive type correspondingly are connected to two instrument amplifier circuits and two electric energy management modules of the current monitoring unit. The magnetic field sensing chip with tunnel junction magneto-resistive type is configured to monitor and convert a magnetic field intensity of the conductor to be measured into an analog differential voltage, and an output terminal of the magnetic field sensing chip with magneto-resistive type connected to the instrument amplifier circuit. The instrument amplifier circuit is implemented by combining an instrument amplification chip with a resistor-capacitor element to amplify the analog differential voltage and output an analog voltage signal. The electric energy management module of the current monitoring unit is composed of a voltage regulator chip and a resistor-capacitor element, and the voltage regulator chip is connected to the magnetic field sensing chip with magneto-resistive type and the instrument amplifier circuit, respectively, so as to provide a power supply voltage for the magnetic field sensing chip with magneto-resistive type and the instrument amplifier circuit, and provide a reference voltage for the instrument amplifier circuit.

The principle of the current measurement by the current monitoring unit 1 is that a corresponding magnetic field is generated around a conductor carrying current, and is amplified by a magnetic ring, and the magnetic field generated at the position of the current monitoring unit circuit has a magnetic field intensity H of the international unit system. According to the Ampere circuital theorem, the relationship between the magnetic field at the magnetic ring air gap and the conductor current is $$H = \frac{\mu_r I}{\mu_r d + \pi(D_1 + D_2)/2 - d}.$$

Generally, since the magnetic field intensity is usually represented in the Gauss unit, i.e., in the unit of Oe (Oersted), if the magnetic field data is converted into the international unit and the magnetic field intensity under the Gauss unit system is set as $H_0$, then $$H_0 = \frac{1000}{4\pi} H.$$

The magnetic field strength H in the international unit is substituted into the relationship between the magnetic field and the conductor current, then $$H_0 = \frac{\mu_r I}{\mu_r d + \pi(D_1 + D_2)/2 - d} \times \frac{1000}{4\pi}.$$

Figure 5:
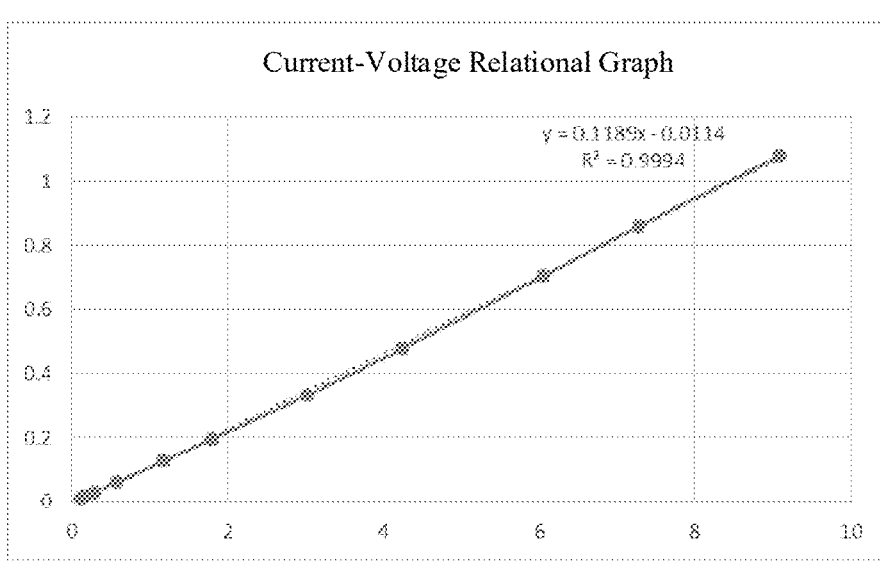
FIG. 5 illustrates a schematic diagram of a system current measurement according to the present disclosure.

The magnetic field sensing chip with tunnel junction magneto-resistive type may linearly output a differential voltage based on the magnetic field intensity at its position, i.e., the magnetic field sensing chip with tunnel junction magneto-resistive type has an input characteristic $V_{OUT}=k \times H_0$, where k is a sensitivity parameter of the tunnel junction magneto-resistive type magnetic field sensing chip and is related to the tunnel junction magneto-resistive type magnetic field sensing chip per se. Further, after the current monitoring unit 1 is manufactured, the air gap length of the ferrite ring is d and a distance between a center of the air gap of the ferrite ring and a center of the conductor to be measured is a fixed value $(D_1+D_2)/2$, so a linear relationship between the differential voltage output by the tunnel junction magneto-resistive type magnetic field sensing chip and the current of the conductor to be measured is $V_{OUT}=k' \times I$. Further, the instrument amplifier circuit linearly amplifies the input differential voltage, so a relationship between an analog voltage output by the current monitoring unit and the current of the conductor to be measured is $V_{OUT}=k'' \times I$, where $$k'' = a \times k \times \frac{\mu_r \times 1000}{[\mu_r d + \pi(D_1 + D_2)/2 - d] \times 4\pi},$$

and a is an amplification factor of the instrument amplifier circuit. The typical relationship between the analog voltage value output by the current monitoring unit and the current of the conductor to be measured is illustrated in FIG. 5, i.e., the analog voltage signal output by the current monitoring unit can be used to measure the currents of the ground wire and the lines of the auxiliary power supply system of the nuclear power plant linearly and accurately.

Figure 6:
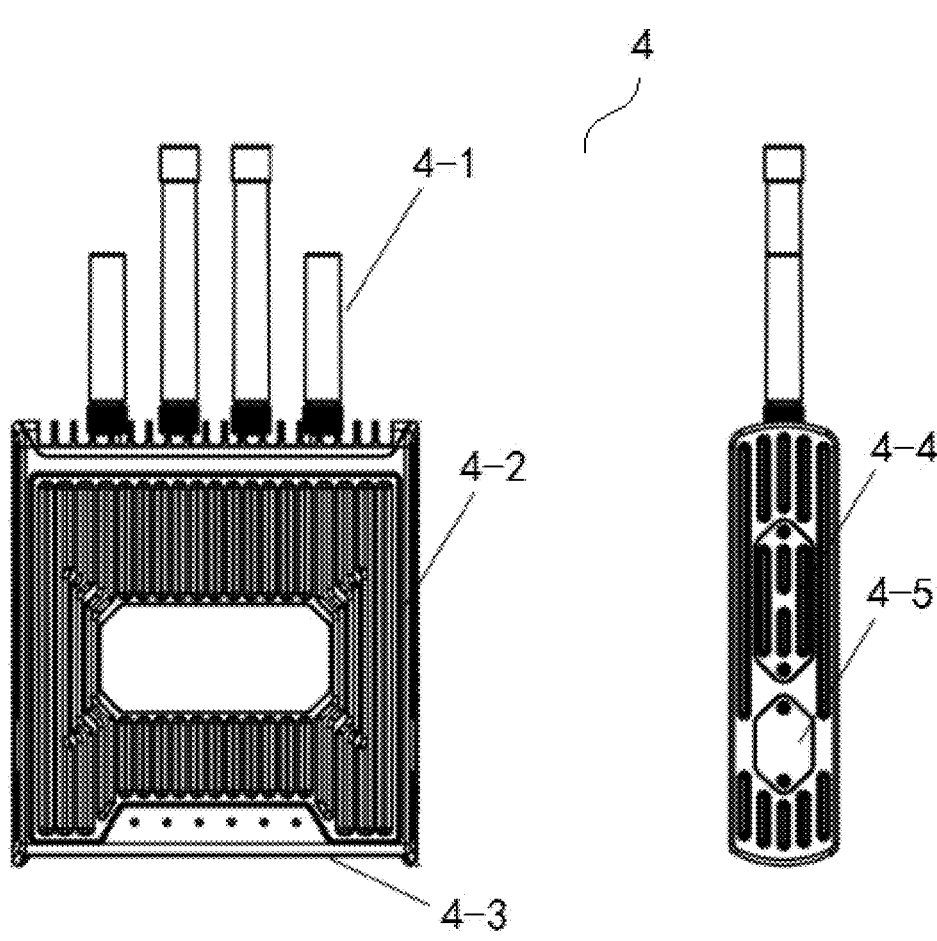
FIG. 6 illustrates a schematic diagram of a relay communication unit according to the present disclosure.

As illustrated in FIG. 6, a hardware part of the relay communication unit 4 includes a body, an antenna 4-1, thermal fin 4-2, a plurality of connecting line interfaces C4-3, a detachable battery compartment 4-4, a system restart key and a debugging interface 4-5. A circuit part of the relay communication unit includes two Micro Control Units (MCUs), a Long Range Radio (LORA) module, an analog-digital converter (ADC), a storage module (FLASH&WD), a Global Navigation Satellite System (GNSS) & Real Time Clock (RTC) module, a power management module of the relay communication unit and corresponding resistor-capacitor elements connected to the power management module. The circuit part of the relay communication unit 4 is arranged on a printed circuit board (PCB), and a connection integration is implemented by printed lines. The antenna 4-1 is disposed at the top of the body and in wired connection with the LORA module and the GNSS&RTC module in the body of the relay communication unit. The LORA module enhances a signal via the antenna, and wirelessly sends data to the data processing unit 6 for data processing. The GNSS&RTC module obtains time data from a satellite via the antenna to realize a data transceiving function of the relay communication unit 4. The thermal fins 4-2 are sheet-like structures, which are uniformly distributed outside the body to reduce the accumulated heat generated when the relay communication unit 4 works. The connecting line interfaces C4-3 are disposed at the bottom of the body for the wired connection between the relay communication unit 4 and the energy extraction unit 5 and the current monitoring unit 1. Meanwhile, the connecting line interfaces C4-3 are in wired connection with the printed circuit board (PCB) inside the body to realize the electrical connection between each unit. The battery compartment 4-4 is disposed on a lateral side of the body, with a battery placed therein, and the battery is in wired connection with the printed circuit board (PCB) inside the body, so that the battery compartment 4-4 can be quickly disassembled when the data processing unit 6 is powered on abnormally. The system restart key and the debugging interface 4-5 are disposed on the lateral side of the body, the relay communication unit 4 is refreshed by clicking the system restart key, and the relay communication unit 4 is connected to a computer through the debugging interface, so as to modify and debug a program of the relay communication unit 4.

The relay communication unit 4 has a plurality of connecting line interfaces C4-3, which are divided into a port a and a port b, wherein the port b of the connecting line interface C4-3 is composed of a plurality of homogeneous interfaces, all of which are connected to the current monitoring unit 1.

An input terminal of the power management module of the relay communication unit 4 is in wired connection with the port a of the connecting line interface C4-3 inside the body. The port a of the connecting line interface C4-3 is in wired connection with a connecting line interface D5-2 of the energy acquisition unit 5 outside the body, and the energy extraction unit 5 wiredly transmits voltage and current to the relay communication unit 4 for supplying power to the relay communication unit 4.

Further, an output terminal of the power management module of the relay communication unit 4 is in wired connection with the port b of the connecting line interface C4-3, and a connection wire, output terminal of the power management module and ports b of connecting line interfaces C4-3 are inside the body. The port b of the connecting line interface C4-3 is in wired connection with the connecting line interfaces A2-2 and B3-2 of the current monitoring unit 1. The port b of one connecting line interface C4-3 is connected to specific device of one current monitoring unit 1, and for example, the port b of the first connecting line interface C4-3 is connected to the connecting line interface A2-2 of the first current monitoring unit 1, and the port b of the second connecting line interface C4-3 is connected to the connecting line interface B3-2 of the second current monitoring unit 1. The wired connection between the current monitoring unit 1 and the relay communication unit 4 is configured to supply power to the current monitoring unit 1 and realize information transmission.

Specifically, the output terminal of the power management module of the relay communication unit 4 is in wired connection with ports b of a plurality of connecting line interfaces C4-3 inside the body, and an input terminal of the power management module of the current monitoring unit 1 is connected to the connecting line interfaces A2-2 and B3-2 of the current monitoring unit 1 inside the body by cables. Meanwhile, an analog signal output terminal of the current monitoring unit 1 is connected to the connecting line inter-face A2-2 and B3-2 of the current monitoring unit 1 by cables, an ADC input terminal of the relay communication unit 4 is connected to the port b of the connecting line interface C4-3 by cables, and the connecting line interfaces A2-2 and B3-2 of the current monitoring unit 1 are exter-nally in wired connection with the port b of the connecting line interface C4-3 of the relay communication unit 4.

The wired connection between the relay communication unit 4 and the current monitoring unit 1 is configured with multi-core wires, so that a current obtainment signal output by the current monitoring unit 1 is transmitted to the relay communication unit 4, and an output terminal of the energy management module of the relay communication unit 4 is connected to a plurality of current monitoring units 1 to provide the working voltage and current.

Figure 7:
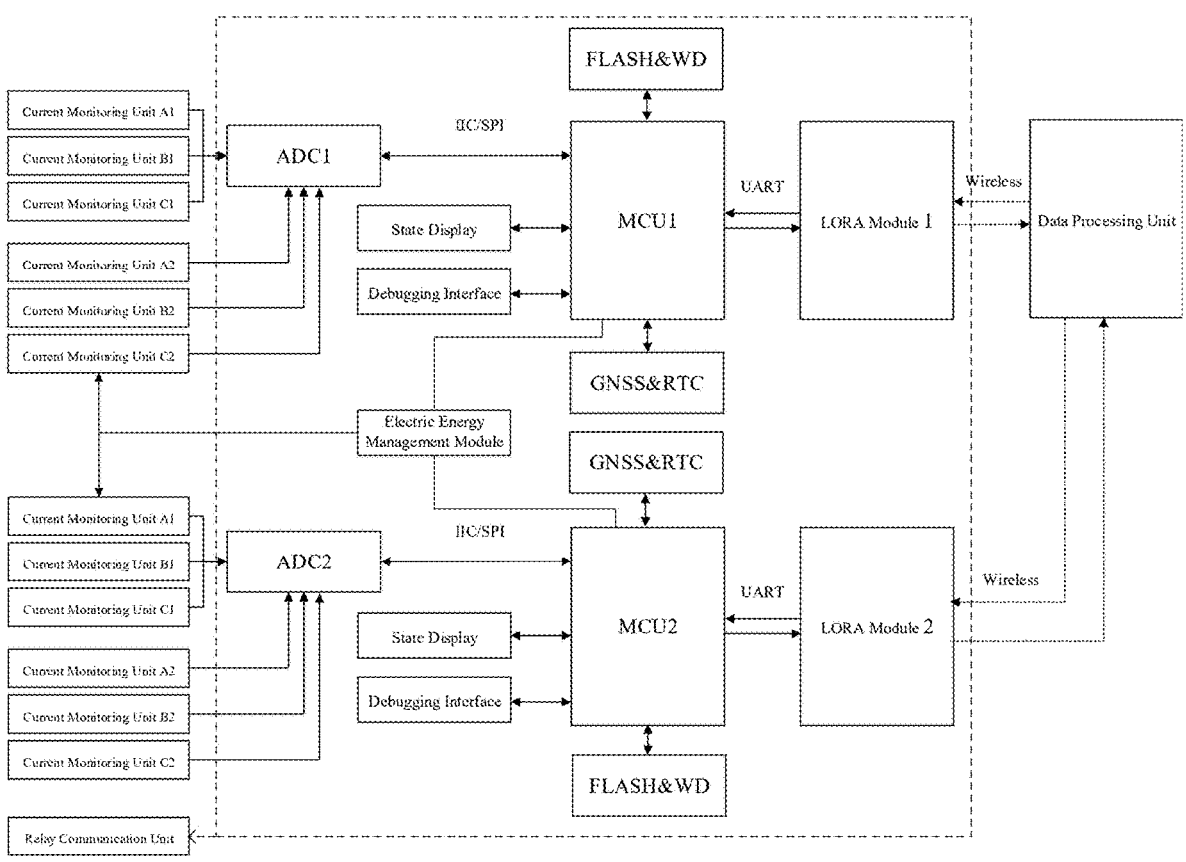
FIG. 7 illustrates a schematic diagram of a topology structure of a relay communication unit according to the present disclosure.

As illustrated in FIG. 7, an MCU of the relay communi-cation unit 4 is used as a central control processing unit and connected to high-speed ADC peripherals, so as to realize the A/D conversion for a plurality of signals. The model of two MCUs is STM32L496RGT6.

The LORA module is connected to the MCU on the printed circuit board (PCB) to realize the function of data wireless communication. The working condition of the LORA module is controlled by the MCU to implement a continuous or intermittent data transmission to an industrial personal computer 6-1, and the data transmission density has a fastest interval of 10 s (one data point per minute by default, i.e., the multi-channel current data at one moment). The model of the LORA module is the CC1310-TC-008 module of Shenzhen Silicontra Technology Co., Ltd.

The GNSS&RTC is configured with the ATGM336H-5N global positioning module (compatible with SIM28M) of Hangzhou Zhongke Micro and the DS1307ZN+T&R real-time clock chip of MAXIM Company, realizes time cali-bration by the connection with the MCU to provide accurate moment signals, and calibrates the system clock continu-ously or intermittently. If the intermittent timing is adopted, the MCU uses its own clock or a peripheral crystal oscillator clock to measure time when a timing module of the GNSS&RTC is closed, so as to achieve a time measurement.

The ADC is configured with the MAX11615 device of MAXIM Company, with a power supply voltage of 2.7V~3.6V, a maximum power consumption of 1.15 mA, and a minimum current in an OFF mode of only 500 nA. During signal processing, the transmitted analog signal is connected to the ADC and converted into a digital signal, and multiplex analog signals may be obtained in a short time.

The FLASH&WD is configured to store the data obtained and converted by the ADC, and the data is written into the FLASH&WD after being processed by the MCU, so that the past data is queried when the open-phase fault monitoring system is failed.

In this embodiment, a low power consumption mode is designed for the relay communication unit 4, and during an interval between two samplings, the high power consump-tion modules such as the LORA module, the ADC and the GNSS&RTC are set to an Off state by the MCU control end, so as to reduce the system power consumption, which is beneficial to reduce the usual power and improve the energy utilization rate. The relay communication unit 4 starts the working mode at a regular interval (1 min by default), and in other time is in a low power consumption mode. In the working mode, the MCU works at full speed, the analog voltage signal output by the current monitoring unit 1 is sampled and converted into a digital signal data by the peripheral ADC, and the digital signal data is transmitted to the data processing unit 6 by the LORA module. The wireless transmission of the LORA module is suitable for long-distance transmission, and the maximum transmission distance of the data may reach 10 km when there is no shelter, thereby effectively realizing the data information exchange.

Figure 8:
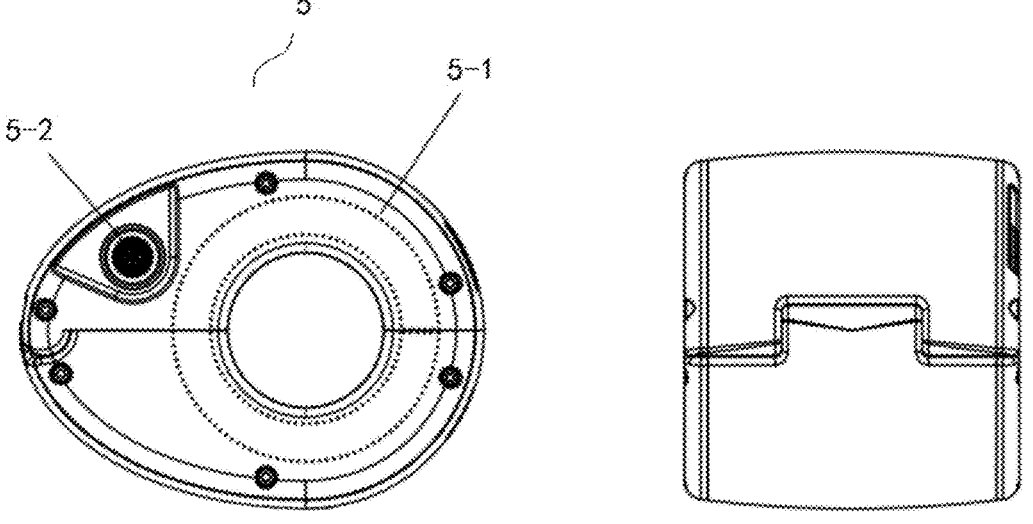
FIG. 8 illustrates a schematic diagram of an energy extraction unit according to the present disclosure.

As illustrated in FIG. 8, the energy extraction unit 5 includes two independent groups of magnetic ring for obtaining electrical energy based on induction principle 5-1, corresponding connecting circuits and a connecting line interface D5-2; the inductive electromagnetic ring 5-1 is wound with a coil and obtains an induced voltage based on the electromagnetic induction principle. An outlet terminal of the coil is connected to an input terminal of the printed circuit board, and a rectifier bridge composed of capacitors is arranged on the printed circuit board. The rectifier bridge includes two input terminals connected to two terminals of the coil respectively and an output terminal connected to an input terminal of a voltage regulator chip, and an output terminal of the voltage regulator chip is in wired connection with the connecting line interface D5-2 inside the body to output a stable voltage. The energy extraction unit 5 obtains electric energy and supplies power to the current monitoring unit 1 and the relay communication unit 4.

Figure 9:
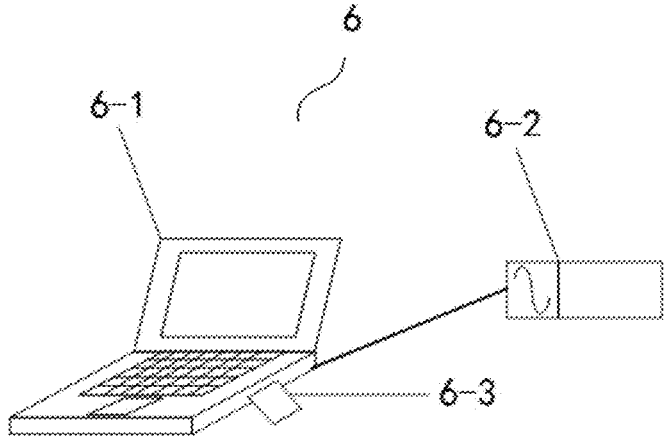
FIG. 9 illustrates a schematic diagram of a data processing unit according to the present disclosure.

As illustrated in FIG. 9, the data processing unit 6 wirelessly receives information sent by the relay communication unit 4 to perform a data analysis, and includes the industrial personal computer 6-1, a relay 6-2 and a LORA receiving device 6-3. The industrial personal computer 6-1 is in wired connection the relay 6-2 by a USB serial port, and directly connected to the LORA receiving device 6-3 by the USB serial port. The industrial personal computer 6-1 receives current data sent by the LORA module in the relay communication unit 4 by the LORA receiving device 6-3, and the current data is directly read by the industrial personal computer 6-1 by the USB serial port with a serial communication mode. The industrial personal computer 6-1 judges the phase opening based on the current data and controls the output of the relay 6-2.

Figure 10:
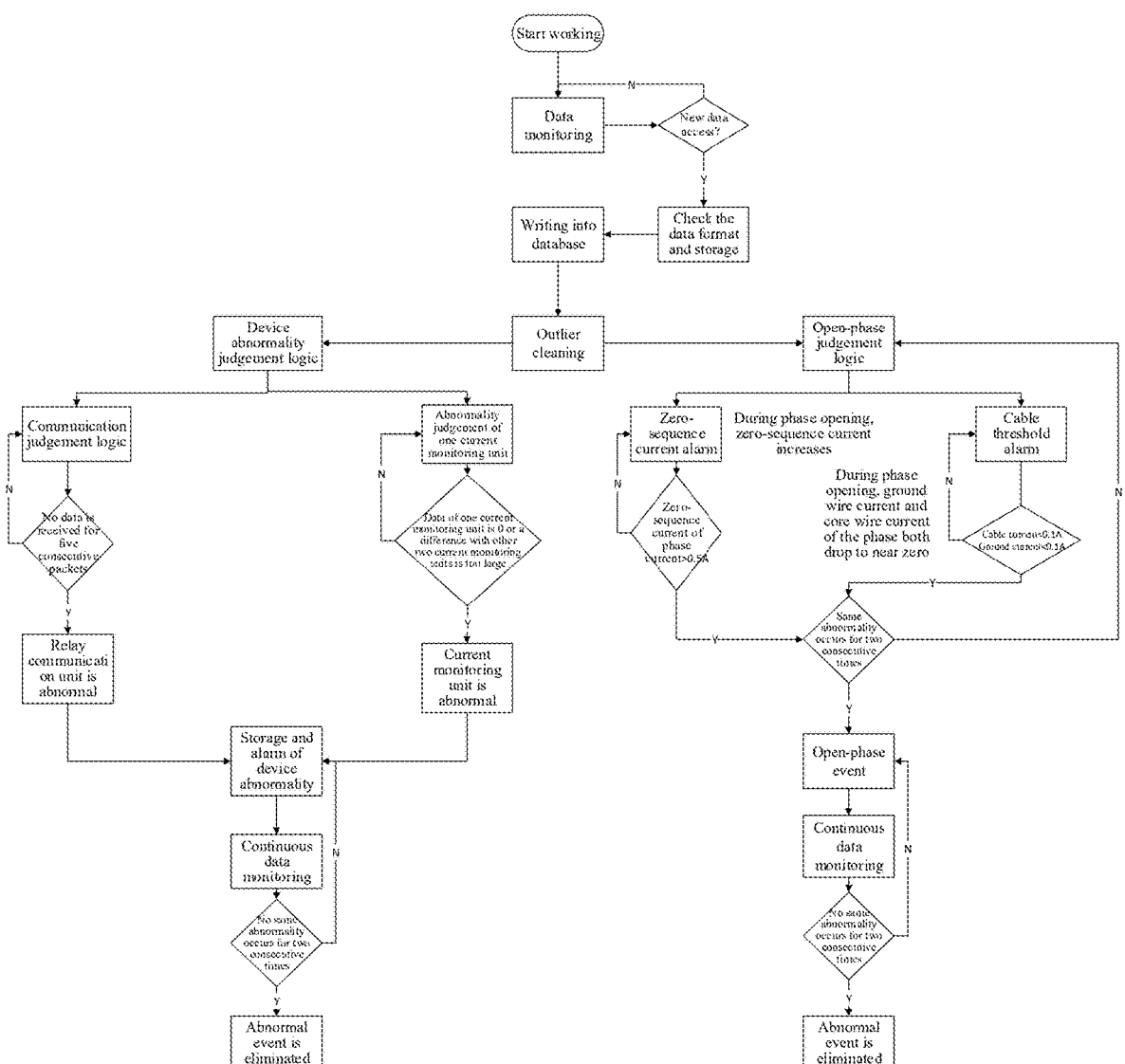
FIG. 10 illustrates a logical schematic diagram of an open-phase monitoring criterion according to the present disclosure.

As illustrated in FIG. 10, the working flow of the data processing unit 6 is as follows:

when the data processing unit 6 starts to work, firstly, the LORA receiving device 6-3 monitors whether there is any new data accessed by the LORA module of the relay communication unit 4; if so, the data format is checked, stored and written into a database, and if there are an outlier, such as packet loss data, wrongly sent data with format errors, etc., they are cleaned in corresponding formats; next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0 or a difference with other two current monitoring units is too large, it is determined that the one current monitoring unit is abnormal; in the judgment algorithm, 'the data is 0' does not absolutely mean 0, but a range of ±0.05; 'a difference with other two current monitoring units is too large' means that if the A-phase of the current monitoring unit is abnormal, the difference between the A-phase of the current monitoring unit and the B-phase of the current monitoring unit and the C-phase of the current monitoring unit may be much greater than one time;

after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated;

if current monitoring data received by the data processing unit 6 meets the following two conditions at the same time, and a same abnormality occurs for two consecutive times, it is determined that an open-phase fault has occurred:

a) open-phase judgment based on a threshold: when phase opening occurs, generally, currents of a ground wire and a core wire of a wire of one phase are dropped and disappeared, and when currents of the ground wire and the core wire both drop to near zero, while currents of other sensors still exist, it is determined that there is an open-phase event;

b) open-phase judgment based on zero-sequence current: under the normal working conditions, there is no zero-sequence current in either of the core wire and the ground wire, and when calculated zero-sequence currents in both the core wire and the ground wire exceed the threshold (e.g., 0.5 A), it is determined that there is an open-phase event;

the current monitoring data received by the data processing unit 6 is continuously monitored after the open-phase fault is eliminated, and when a same abnormality does not appear for two consecutive times, it is determined that an abnormal event is eliminated.

Those described above are only optional embodiments of the present disclosure, and are not intended to limit the present disclosure. Any modification, equivalent substitution, improvement, etc. made within the spirit and principle of the present disclosure should be included in the protection scope of the present disclosure.

In addition, it should be understood that although the specification is illustrated in terms of the embodiments, not every embodiment only contains one independent technical solution, and such description of the specification is only for the purpose of clarity. Those skilled in the art should take the specification as a whole, and the technical solutions in various embodiments may also be appropriately combined to form other embodiments that can be understood by those skilled in the art.

The key points of the present disclosure are as follows:

1. The circuit structure of the current monitoring unit of the present disclosure includes a magnetic field sensing chip with magneto-resistive type, which achieves a minimum measurement accuracy of 5 mA by converting the magnetic field signal, and may accurately measure each current change of the primary circuit of the device.

2. The relay communication unit of the present disclosure is configured with the MCU as the central control processing unit, and the external ADC can realize high-speed A/D conversion for a plurality of signals. The timing function is realized by the GNSS&RTC of the relay communication unit, the data interaction function is realized by the LORA module, and the data is sent to the background industrial personal computer based on the designed sampling frequency.

3. Mechanical structures of the current monitoring unit and the relay communication unit of the present disclosure are suitable for the environments of high humidity and strong electric field, and have beautiful appearances while effectively protecting the internal circuits.

4. The data processing unit of the present disclosure implements the identification and alarm of the line open-phase fault by combining the threshold criterion and the zero-sequence current criterion based on the relevant data of the monitored current.

5. The present disclosure designs a low-power consumption mode based on an MCU, and the device works at an interval of 60 s based on a working logic of 'low-power sleep—data obtainment—data transmission—low-power sleep, thereby realizing an ultra-low power consumption of 700 uWh on average per minute.

The invention claimed is:

1. An open-phase fault monitoring system, comprising a current monitoring unit, a relay communication unit, an energy extraction unit and a data processing unit, wherein:

the current monitoring unit is configured to monitor multipath current signals, and comprises a cable current monitoring unit and a ground current monitoring unit, wherein the cable current monitoring unit is configured to monitor current flowing through a transformer cable, and the ground current monitoring unit is configured to monitor current flowing through a reverse current ground wire;

each of the cable current monitoring unit and the ground current monitoring unit is an ring shape and is enclosed by two ferrite rings, where a center hole passes through a conductor to be measured and a magnetic ring air gap is machined on one of the ferrite rings to arrange a current monitoring unit circuit, wherein one terminal of each of the two ferrite rings is connected by a rotation shaft, and the other terminal thereof is provided with a connecting line interface where a connecting line is inserted to connect the current monitoring unit with the relay communication unit; the cable current monitoring unit and the ground current monitoring unit have a same circuit structure, both comprising two magnetic field sensing chips with tunnel junction magneto-resistive type, and the two magnetic field sensing chips with tunnel junction magneto-resistive type are correspondingly connect to two instrument amplifier circuits and two electric energy management modules of the current monitoring unit;

a hardware part of the relay communication unit comprises a body, an antenna, a connecting line interface C, a battery compartment, a system restart key and a debugging interface; a circuit part of the relay communication unit is disposed on a printed circuit board, and comprises an MCU, a LORA module, an ADC a FLASH&WD, a GNSS&RTC module, a power management module of the relay communication unit and corresponding resistor-capacitor elements connected to the power management module;

the antenna is disposed at the top of the body and connected to the LORA module and the GNSS&RTC module in the body of the relay communication unit; the LORA module enhances a signal via the antenna, and wirelessly sends data to the data processing unit for data processing; the GNSS&RTC module obtains time data from a satellite via the antenna to realize a data transceiving function of the relay communication unit; the connecting line interfaces C is disposed at the bottom of the body for a wired connection between the relay communication unit and the energy extraction unit and the current monitoring unit, and the connecting line interface C is connected to the printed circuit board and the power management module of the relay communication unit inside the body; and the battery compartment is disposed on a lateral side of the body, with a battery placed therein, and the battery is connected to the printed circuit board inside the body; the system restart key and the debugging interface are disposed on a lateral side of the body, the relay communication unit is refreshed by clicking the system restart key, and the relay communication unit is connected to a computer by the debugging interface, so as to modify and debug a program of the relay communication unit;

the MCU of the relay communication unit is used as a central control processing unit and connected to ADC peripheral, the ADC converts the transmitted analog signal into a digital signal, and multipath analog signals is obtained in a short time; the FLASH&WD stores the data obtained and converted by the ADC, and the data is written into the FLASH&WD after being processed by the MCU, so that the past data is queried when the open-phase fault monitoring system is failed;

the LORA module is connected to the MCU on the printed circuit board to realize a function of data wireless communication, and a working condition of the LORA module is controlled by the MCU to realize a continuous or intermittent data transmission to an industrial personal computer;

the GNSS&RTC realizes a time calibration by a connection with the MCU to provide accurate moment signals, and calibrates a system clock continuously or intermittently;

the energy extraction unit comprises two independent groups of magnetic ring for obtaining electrical energy based on induction principle, corresponding connecting circuits and a connecting line interface D; the inductive electromagnetic ring is wound with a coil, an outlet terminal of the coil is connected to an input terminal of the printed circuit board, and a rectifier bridge composed of capacitors is arranged on the printed circuit board; the rectifier bridge comprises two input terminals connected to two terminals of the coil respectively and an output terminal connected to an input terminal of a voltage regulator chip, and an output terminal of the voltage regulator chip outputs via the connecting line interface D; and the energy extraction unit obtains electric energy and supplies power to the current monitoring unit and the relay communication unit; and the data processing unit wirelessly receives information sent by the relay communication unit to perform a data analysis, and comprises the industrial personal computer, a relay and a LORA receiving device; the industrial personal computer is in wired connection the relay by a USB serial port, and directly connected to the LORA receiving device by a USB serial port; the industrial personal computer receives current data sent by the LORA module in the relay communication unit by the LORA receiving device, and the current data is directly read by the industrial personal computer by the USB serial port with a serial communication mode; the industrial personal computer judges phase opening based on the current data and controls the output of the relay.

2. The open-phase fault monitoring system according to claim 1, wherein:

the magnetic field sensing chip with tunnel junction magneto-resistive type is configured to monitor and convert a magnetic field intensity of the conductor to be measured into an analog differential voltage, wherein an output terminal of the magnetic field sensing chip with magneto-resistive type is connected to the instrument amplifier circuit; the instrument amplifier circuit is implemented by combining an instrument amplification chip with a resistor-capacitor element to amplify the analog differential voltage and output an analog voltage signal; and the electric energy management module of the current monitoring unit is composed of a voltage regulator chip, and the voltage regulator chip is connected to the magnetic field sensing chip with magneto-resistive type and the instrument amplifier circuit, respectively, so as to provide a power supply voltage for the magnetic field sensing chip with magneto-resistive type and the instrument amplifier circuit, and provide a reference voltage for the instrument amplifier circuit.

3. The open-phase fault monitoring system according to claim 1, wherein the connecting line interface C is in wired connection with the connecting line interface D of the energy extraction unit to supply power for the relay communication unit, and an output terminal of the power management module of the relay communication unit is in wired connection with the connecting line interface C inside the body.

4. The open-phase fault monitoring system according to claim 3, wherein the connecting line interface C is connected to connecting line interfaces A and B of the current monitoring unit to supply power for the current monitoring unit and realize an information transmission.

5. The open-phase fault monitoring system according to claim 4, wherein:

the output terminal of the power management module of the relay communication unit is in wired connection with the connecting line interface C, and an input terminal of the power management module of the current monitoring unit is in wired connection with the connecting line interfaces A and B; and an analog signal output terminal of the current monitoring unit is connected to the connecting line interfaces A and B of the current monitoring unit by cables, an ADC input terminal of the relay communication unit is connected to the connecting line interface C by cables, and the connecting line interfaces A and B of the current monitoring unit are externally in wired connection with the connecting line interface C of the relay communication unit.

6. The open-phase fault monitoring system according to claim 1, wherein the wired connection between the relay communication unit and the current monitoring unit is configured with multi-core wires, so that a current obtainment signal output by the current monitoring unit is transmitted to the relay communication unit, and energy output by the energy management module of the relay communication unit is transmitted to a plurality of the current monitoring units.

7. The open-phase fault monitoring system according to claim 1, wherein the hardware part of the relay communication unit further comprises thermal fins (4-2) uniformly distributed outside the body to reduce accumulated heat generated when the relay communication unit works.

8. The open-phase fault monitoring system according to claim 1, wherein if intermittent timing is configured with, the MCU uses its own clock or a peripheral crystal oscillator clock to count time when a timing module of the GNSS&RTC is closed, so as to achieve a time measurement.

9. The open-phase fault monitoring system according to claim 1, wherein:

when the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats; next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is $0\pm0.05$ or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

10. The open-phase fault monitoring system according to claim 9, wherein if current monitoring data received by the data processing unit meets the following two conditions at the same time, and a same abnormality occurs for two consecutive times, it is determined that an open-phase fault has occurred:

a) open-phase judgment based on a threshold: when phase opening occurs, generally, currents of a ground wire and a core wire of a wire of one phase are dropped and disappeared, and when currents of the ground wire and the core wire both drop to near zero, while currents of other sensors still exist, it is determined that there is an open-phase event;

b) open-phase judgment based on zero-sequence current: under normal working conditions, there is no zero-sequence current in either of the core wire and the ground wire, and when calculated zero-sequence currents in both the core wire and the ground wire exceed a threshold, it is determined that there is an open-phase event;

the current monitoring data received by the data processing unit is continuously monitored after the open-phase fault is eliminated, and when a same abnormality does not appear for two consecutive times, it is determined that an abnormal event is eliminated.

11. The open-phase fault monitoring system according to claim 2, wherein:

when the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats; next, it is judged whether there is any device abnormality or phase opening, when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

12. The open-phase fault monitoring system according to claim 3, wherein:

when the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats; next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

13. The open-phase fault monitoring system according to claim 4, wherein:

when the data processing unit starts to work, firstly, the LORA receiving device monitors whether there is any new data accessed by the LORA module of the relay communication unit, if so, a data format is checked, stored and written into a database, and if there are an outlier, the outlier is cleaned in corresponding formats; next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

14. The open-phase fault monitoring system according to claim 5, wherein:

when the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats; next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

15. The open-phase fault monitoring system according to claim 6, wherein:

when the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats; next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

16. The open-phase fault monitoring system according to claim 7, wherein:

when the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats, next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

17. The open-phase fault monitoring system according to claim 8, wherein:

when the data processing unit starts to work, firstly, the LORA receiving device monitors whether there is any new data accessed by the LORA module of the relay communication unit; if so, a data format is checked, stored and written into a database, and if there are an outlier, the outlier is cleaned in corresponding formats; next, it is judged whether there is any device abnormality or phase opening;

when any one of the following situations occurs, it is determined that there is a device abnormality:

a) communication abnormality judgment: if one current monitoring unit does not receive data for five consecutive data time points, it is determined that the communication is abnormal and a background reports an alarm 'the relay communication unit is abnormal';

b) abnormality judgment of one current monitoring unit: when the data of one current monitoring unit is 0±0.05 or a difference with other two current monitoring units is much greater than one time, it is determined that the one current monitoring unit is abnormal; and after the device abnormality is eliminated, the data of each current monitoring unit is continuously monitored, and the data incoming from the one current monitoring unit appearing abnormal for two consecutive times is judged; if there is no same abnormality, it is determined that an abnormal event is eliminated.

18. The open-phase fault monitoring system according to claim 11, wherein if current monitoring data received by the data processing unit meets the following two conditions at the same time, and a same abnormality occurs for two consecutive times, it is determined that an open-phase fault has occurred:

a) open-phase judgment based on a threshold: when phase opening occurs, generally, currents of a ground wire and a core wire of a wire of one phase are dropped and disappeared, and when currents of the ground wire and the core wire both drop to near zero, while currents of other sensors still exist, it is determined that there is an open-phase event;

b) open-phase judgment based on zero-sequence current: under normal working conditions, there is no zero-sequence current in either of the core wire and the ground wire, and when calculated zero-sequence currents in both the core wire and the ground wire exceed a threshold, it is determined that there is an open-phase event;

the current monitoring data received by the data processing unit is continuously monitored after the open-phase fault is eliminated, and when a same abnormality does not appear for two consecutive times, it is determined that an abnormal event is eliminated.

19. The open-phase fault monitoring system according to claim 14, wherein if current monitoring data received by the data processing unit meets the following two conditions at the same time, and a same abnormality occurs for two consecutive times, it is determined that an open-phase fault has occurred:

a) open-phase judgment based on a threshold: when phase opening occurs, generally, currents of a ground wire and a core wire of a wire of one phase are dropped and disappeared, and when currents of the ground wire and the core wire both drop to near zero, while currents of other sensors still exist, it is determined that there is an open-phase event, b) open-phase judgment based on zero-sequence current: under normal working conditions, there is no zero-sequence current in either of the core wire and the ground wire, and when calculated zero-sequence currents in both the core wire and the ground wire exceed a threshold, it is determined that there is an open-phase event;

the current monitoring data received by the data processing unit is continuously monitored after the open-phase fault is eliminated, and when a same abnormality does not appear for two consecutive times, it is determined that an abnormal event is eliminated.

20. The open-phase fault monitoring system according to claim 17, wherein if current monitoring data received by the data processing unit meets the following two conditions at the same time, and a same abnormality occurs for two consecutive times, it is determined that an open-phase fault has occurred:

a) open-phase judgment based on a threshold: when phase opening occurs, generally, currents of a ground wire and a core wire of a wire of one phase are dropped and disappeared, and when currents of the ground wire and the core wire both drop to near zero, while currents of other sensors still exist, it is determined that there is an open-phase event;

b) open-phase judgment based on zero-sequence current: under normal working conditions, there is no zero-sequence current in either of the core wire and the ground wire, and when calculated zero-sequence currents in both the core wire and the ground wire exceed a threshold, it is determined that there is an open-phase event;

the current monitoring data received by the data processing unit is continuously monitored after the open-phase fault is eliminated, and when a same abnormality does not appear for two consecutive times, it is determined that an abnormal event is eliminated.

* * * * *